(12) United States Patent
Chen et al.

(10) Patent No.: US 10,020,164 B2
(45) Date of Patent: Jul. 10, 2018

(54) CHARGED PARTICLE BEAM APPARATUS

(71) Applicant: Hermes Microvision Inc., Hsin-Chu (TW)

(72) Inventors: Zhongwei Chen, San Jose, CA (US); Jack Jau, Los Altos Hills, CA (US); Weiming Ren, San Jose, CA (US)

(73) Assignee: HERMES MICROVISION INC., Hsinchu (TW)

( * ) Notice: Subject to any disclaimer, the term of this patent is extended or adjusted under 35 U.S.C. 154(b) by 0 days.

(21) Appl. No.: 14/560,784

(22) Filed: Dec. 4, 2014

(65) Prior Publication Data
US 2015/0083912 A1 Mar. 26, 2015

Related U.S. Application Data

(62) Division of application No. 14/220,358, filed on Mar. 20, 2014, now Pat. No. 9,190,241.
(Continued)

(51) Int. Cl.
*H01J 37/28* (2006.01)
*H01J 37/26* (2006.01)
(Continued)

(52) U.S. Cl.
CPC ............ *H01J 37/28* (2013.01); *H01J 37/026* (2013.01); *H01J 37/10* (2013.01); *H01J 37/14* (2013.01); *H01J 37/20* (2013.01); *H01J 37/22* (2013.01); *H01J 37/244* (2013.01); *H01J 37/261* (2013.01); *H01J 37/285* (2013.01);
(Continued)

(58) Field of Classification Search
CPC ........ H01J 37/28; H01J 37/244; H01J 37/147; H01J 2237/24475; H01J 2237/2801; H01J 37/261; H01J 2237/04926; H01J 2237/1405; H01J 2237/2804; H01J 37/10; H01J 37/14; H01J 37/20; H01J 37/22; H01J 2237/063; H01J 2237/10; H01J 2237/2806; H01J 37/226
See application file for complete search history.

(56) References Cited

U.S. PATENT DOCUMENTS 3,714,424 A * 1/1973 Weber ................... H01J 37/244
 250/310
3,842,271 A 10/1974 Gee et al.
(Continued)

OTHER PUBLICATIONS

Agilent 101: Intro to Nanotechnology, published at http://www.agilent.com/labs/features/2011_101_nano.html in Jun. 2011 (retrieved May 18, 2017).*
(Continued)

*Primary Examiner* — Wyatt Stoffa
(74) *Attorney, Agent, or Firm* — Finnegan, Henderson, Farabow, Garrett & Dunner, LLP

(57) ABSTRACT

The present invention provides apparatuses to inspect small particles on the surface of a sample such as wafer and mask. The apparatuses provide both high detection efficiency and high throughput by forming Dark-field BSE images. The apparatuses can additionally inspect physical and electrical defects on the sample surface by form SE images and Bright-field BSE images simultaneously. The apparatuses can be designed to do single-beam or even multiple single-beam inspection for achieving a high throughput.

7 Claims, 8 Drawing Sheets

Related U.S. Application Data

(60) Provisional application No. 61/804,794, filed on Mar. 25, 2013.

(51) Int. Cl.
  *H01J 37/10* (2006.01)
  *H01J 37/14* (2006.01)
  *H01J 37/20* (2006.01)
  *H01J 37/22* (2006.01)
  *H01J 37/244* (2006.01)
  *H01J 37/02* (2006.01)
  *H01J 37/285* (2006.01)
  *H01J 37/29* (2006.01)

(52) U.S. Cl.
  CPC ... *H01J 37/292* (2013.01); *H01J 2237/04926* (2013.01); *H01J 2237/1405* (2013.01); *H01J 2237/24475* (2013.01); *H01J 2237/24495* (2013.01); *H01J 2237/24528* (2013.01); *H01J 2237/2801* (2013.01); *H01J 2237/2804* (2013.01); *H01J 2237/2806* (2013.01); *H01J 2237/2814* (2013.01)

(56) References Cited

U.S. PATENT DOCUMENTS

| | | | | |
|---|---|---|---|---|
| 4,068,123 | A | 1/1978 | Kokubo | |
| 4,743,757 | A * | 5/1988 | Coates | H01J 37/244 250/310 |
| 4,897,545 | A | 1/1990 | Danilatos | |
| 4,962,306 | A * | 10/1990 | Hodgson | H01J 37/244 250/305 |
| 5,408,098 | A * | 4/1995 | Wells | H01J 37/244 250/305 |
| 5,422,486 | A * | 6/1995 | Herrmann | H01J 37/244 250/310 |
| 6,211,525 | B1 * | 4/2001 | Cowham | H01J 37/244 250/397 |
| 6,300,629 | B1 * | 10/2001 | Lawrence | G01N 23/225 250/310 |
| 6,392,231 | B1 | 5/2002 | Chen | |
| 6,627,886 | B1 * | 9/2003 | Shachal | H01J 27/14 250/305 |
| 6,627,896 | B1 | 9/2003 | Hashimoto et al. | |
| 6,730,907 | B1 * | 5/2004 | Feuerbaum | H01J 37/244 250/307 |
| 6,872,944 | B2 * | 3/2005 | Todokoro | H01J 37/244 250/305 |
| 7,009,187 | B2 * | 3/2006 | Gerlach | H01J 37/244 250/397 |
| 7,276,694 | B1 * | 10/2007 | Bertsche | H01J 37/244 250/305 |
| 7,339,167 | B2 * | 3/2008 | Ohshima | H01J 37/244 250/289 |
| 7,544,937 | B2 * | 6/2009 | Frosien | H01J 37/05 250/310 |
| 8,203,119 | B2 * | 6/2012 | Degenhardt | H01J 37/244 250/296 |
| 8,222,600 | B2 * | 7/2012 | Zarchin | H01J 37/244 250/307 |
| 8,767,038 | B2 * | 7/2014 | Miyamoto | G01B 15/04 250/307 |
| 8,791,425 | B2 | 7/2014 | Ren et al. | |
| 9,053,905 | B2 * | 6/2015 | Hoque | H01J 37/28 |
| 2002/0109089 | A1 * | 8/2002 | Krans | H01J 37/12 250/310 |
| 2005/0001165 | A1 * | 1/2005 | Parker | H01J 37/244 250/310 |
| 2006/0033035 | A1 * | 2/2006 | Itzkovitch | B82Y 10/00 250/396 ML |
| 2006/0054817 | A1 * | 3/2006 | Parker | H01J 37/244 250/310 |
| 2006/0113474 | A1 * | 6/2006 | Todokoro | G01N 23/225 250/310 |
| 2006/0186351 | A1 * | 8/2006 | Nishiyama | H01J 37/244 250/492.1 |
| 2006/0249686 | A1 * | 11/2006 | Slowko | H01J 37/244 250/397 |
| 2006/0289748 | A1 * | 12/2006 | Schon | G01N 23/2251 250/306 |
| 2007/0029479 | A1 * | 2/2007 | Gignac | G01N 23/225 250/310 |
| 2007/0120056 | A1 * | 5/2007 | Nagatomo | B82Y 10/00 250/310 |
| 2008/0023641 | A1 * | 1/2008 | Takeuchi | H01J 37/09 250/396 ML |
| 2008/0035843 | A1 * | 2/2008 | Hatano | H01J 37/244 250/288 |
| 2008/0258060 | A1 * | 10/2008 | Frosien | H01J 37/1478 250/310 |
| 2009/0230304 | A1 * | 9/2009 | Hatano | H01J 37/244 250/311 |
| 2009/0242792 | A1 | 10/2009 | Hosoya et al. | |
| 2010/0012838 | A1 | 1/2010 | Hatakeyama et al. | |
| 2010/0090109 | A1 * | 4/2010 | Hatano | H01J 37/244 250/310 |
| 2010/0200750 | A1 * | 8/2010 | Mantz | H01J 37/05 250/310 |
| 2012/0037802 | A1 * | 2/2012 | Kneedler | H01J 37/244 250/307 |
| 2012/0043463 | A1 * | 2/2012 | Agemura | H01J 37/244 250/310 |
| 2012/0112063 | A1 * | 5/2012 | Schertel | G01N 1/32 250/307 |
| 2012/0298864 | A1 * | 11/2012 | Morishita | H01J 37/244 250/310 |
| 2013/0037715 | A1 * | 2/2013 | Boughorbel | H01J 37/222 250/307 |
| 2013/0214156 | A1 * | 8/2013 | Kneedler | H01J 37/244 250/307 |
| 2013/0277554 | A1 * | 10/2013 | Ren | H01J 37/261 250/310 |
| 2013/0299698 | A1 * | 11/2013 | Schamber | H01J 37/244 250/310 |
| 2013/0320228 | A1 * | 12/2013 | Lanio | H01J 37/244 250/397 |
| 2014/0070098 | A1 * | 3/2014 | Sytar | H01J 37/145 250/307 |
| 2014/0197310 | A1 * | 7/2014 | Hill | G01N 23/2254 250/307 |
| 2014/0246584 | A1 * | 9/2014 | Hyun | H01J 37/026 250/310 |
| 2014/0353498 | A1 | 12/2014 | Shur | |

OTHER PUBLICATIONS

"Low Vacuum Secondary Electron Detector," JEOL USA, Peabody MA, www.jeolusa.com, 2011.

* cited by examiner

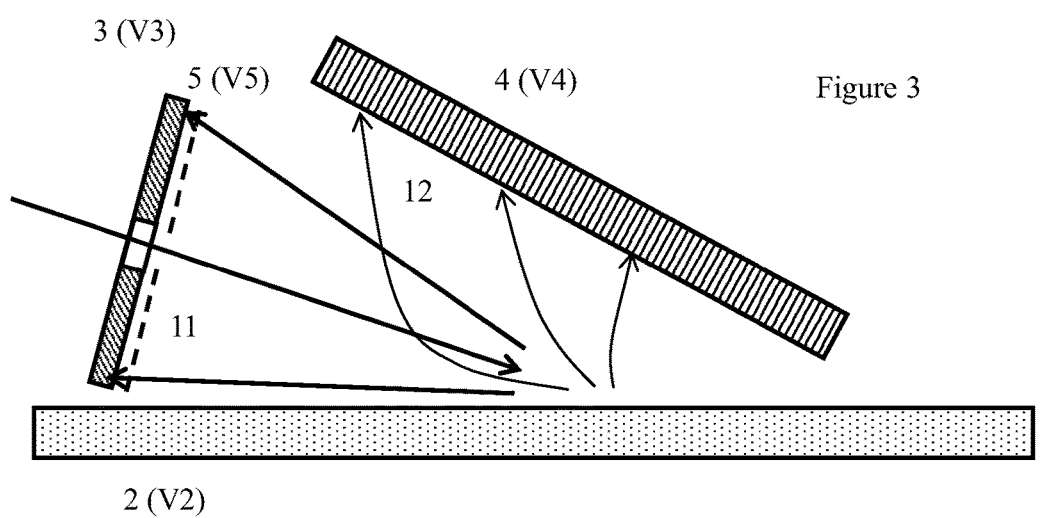

CHARGED PARTICLE BEAM APPARATUS

CLAIM OF PRIORITY

This application is a division of U.S. application Ser. No. 14/220,358, filed Mar. 20, 2014, which claims the benefit of priority of U.S. provisional application No. 61/804,794 entitled to inventors filed Mar. 25, 2013, the entire disclosures of which are incorporated herein by reference.

BACKGROUND OF THE INVENTION

1. Field of the Invention

The present invention relates to a charged particle beam apparatus which employs a scanning electron microscope (SEM) to inspect particles and/or defects on a sample surface. More particularly, it relates to a low-voltage scanning electron microscope (LVSEM) for inspecting particles and/or defects on surfaces of wafers or masks in semiconductor manufacturing industry.

2. Description of the Prior Art

In semiconductor manufacturing industry, sometime particles appear and remain on surfaces of masks and/or wafers during semiconductor fabrication process for some reasons, which impact the yield to a great degree. To monitor and therefore ensure the yield, optical apparatuses or called optical tools which are typically based on microscopy, have been employed to inspect particles after some fabrication processes because of their high inspection throughput and a good detection efficiency. As integrations of IC chips are required higher and higher, critical dimensions of patterns on wafer and mask are shrunk, and consequently smaller and smaller particles become killers in the yield. On development trends, optical tools are losing their abilities to detect killer particles due to their longer wavelengths relative to particle dimensions.

Theoretically, an electron beam (e-beam) has a relatively shorter wavelength (such as 0.027 nm/2 keV) relative to particle dimensions (down to several nm), and therefore can provide higher detection sensitivity for small particles than an optical beam. Higher detection efficiency comes from higher detection sensitivity. Conventional e-beam apparatuses or called e-beam tools for inspecting defects on wafer/mask, which are based on Low-voltage Scanning Electron Microscopy (LVSEM), can directly perform particle inspection. However they are always criticized for low throughput. A large beam current is necessary to get a high throughput, but incurs strong Coulomb Effect which impacts the image resolution and thereby reducing the sensitivity.

Accordingly, a new-type e-beam tool especially for small particle inspection, which can provide high detection efficiency and high inspection throughput, is needed. In addition, it will be advantageous if the tool can perform defect inspection as well.

SUMMARY OF THE INVENTION

The object of this invention is to provide an electron beam apparatus employing LVSEM technology to inspect particles in a sample surface. Firstly, this invention employs the difference between the irregular scattering on particles and regular scattering on sample surface due to an illumination of a primary electron (PE) beam. By specifically arranging illumination of PE beam and Collection of Backscattered Electrons (BSEs) and Secondary Electrons (SEs) in a column of the apparatus, the apparatus can provide high detection sensitivity and high inspection throughput. Secondly, in the column, the objective lens and/or the condenser lens are compacted by using permanent magnets. The compact objective not only enables a favorable illumination of the PE beam, but also reduces the size of the column. Then, this invention configures the apparatus to accommodate multiple foregoing compact columns so as to inspect multiple areas of a sample simultaneously. So, this invention will especially benefit the particle inspection in semiconductor yield management.

Accordingly, the invention therefore provides a method for inspecting a surface of a sample, which comprises steps of providing a primary electron beam (PE beam) to illuminate and scan the surface of the sample by oblique incidence, providing a first detector to detect backscattered electrons generated from the surface of the sample and traveling towards an incidence side of the PE beam, and providing an electrode to collect secondary electrons generated from the surface of the sample so as not to hit the first detector. The first detector has a through hole for the PE beam passing through. The electrode is placed close to the illuminated area on the surface of the sample. The inspecting method may further comprise a step of providing a second detector to detect backscattered electrons generated from the surface of the sample and traveling towards a reflection side of the PE beam.

The present invention further provides a method for inspecting a surface of a sample, which comprises steps of providing a primary electron beam (PE beam) to illuminate and scan the surface of the sample by oblique incidence, providing a first detector to detect backscattered electrons generated from the surface of the sample and traveling towards an incidence side of the PE beam, providing a grid electrode to attract and make secondary electrons generated from the surface of the sample pass through, and providing a second detector to detect the secondary electrons passing through the grid electrode. The first detector has a through hole for the PE beam passing through. The grid electrode is placed close to the illuminated area on the surface of the sample. The inspecting method may further comprise a step of providing a third detector to detect backscattered electrons generated from the surface of the sample and traveling towards a reflection side of the PE beam.

The present invention therefore provides a device of detecting electrons generated from a surface of a sample, which comprises a first detector having a through hole on an electron detection plane thereof, and a first electrode beside the first detector and close to the sample surface so as to attract and prevent secondary electrons generated therefrom (called as SEs) from hitting the first detector. The through hole is for a primary electron beam (PE beam) passing through and illuminating the sample surface by oblique incidence, and the electron detection plane is inclined towards the sample surface so as to collect backscattered electrons generated therefrom by the PE beam and traveling towards an incidence side thereof (called as Dark-field BSEs).

The first electrode can have a grid structure so as to attract and make the SEs pass through. The detecting device may further comprise a second detector behind the first electrode so as to detect the SEs therethrough. The detecting device may further comprise a third detector on an reflection side of the PE beam, wherein the third detector is inclined towards the sample surface so as to collect backscattered electrons generated therefrom by the PE beam and traveling towards the reflection side (called as Bright-field BSEs). The detecting device may further comprise a second electrode in front of the electron detection plane of the first detector, wherein the second electrode has a grid structure so as to repel and prevent the SEs from passing through and make the Bright-field BSEs pass through.

The present invention therefore provides a single-beam apparatus which comprises an electron source emitting primary electrons along an optical axis of the single-beam apparatus, a gun aperture plate below the electron source and having at least one first opening, a condenser lens below the gun aperture plate and aligned with the optical axis, a beam-limit aperture plate below the condenser lens and having at least one second opening, a magnetic objective lens below the beam-limit aperture plate and aligned with the optical axis, a first scanning deflector inside a bore of the magnetic objective lens, a first detector below the magnetic objective lens and having a through hole, an attraction electrode beside the first detector, and a sample stage below the first detector and attraction electrode and for supporting a sample. The primary electrons form a primary electron beam (PE beam). One of the first openings is aligned with the optical axis and limits a current of the PE beam to a first current value. One of the second openings is aligned with the optical axis and limits the current of the PE beam to a second current value. The through hole is on an electron detection plane of the first detector and aligned with the optical axis so that the PE can pass through. A being-inspected surface of the sample is upturned. An illumination angle formed between the optical axis and a normal of the being-inspected surface is larger than 0°. The condenser lens and magnetic objective lens together focus the PE beam onto that being-inspected surface, thereby forming illumination thereon. The electron detection plane of the first detector faces aslant that being-inspected surface so as to collect backscattered electrons which are generated therefrom by the PE beam and travel towards an incidence side thereof (called as Dark-field BSEs). The attraction electrode attracts secondary electrons generated from that being-inspected surface by the PE beam (called as SEs) so as to prevent said SEs from hitting the first detector. The first scanning deflector deflects the PE beam so as to scan the being-inspected surface, thereby obtaining a Dark-field BSEs image by said first detector.

The single-beam apparatus may further comprise a second scanning deflector above the first scanning deflector, wherein the first and second scanning deflectors together deflect the PE beam so as to scan that being-inspected surface with smaller deflection aberrations.

The illumination angle is preferred equal to or larger than 45°. The attraction electrode can have a grid structure so as to attract and make the SEs pass therethrough. The single-beam apparatus may further comprise a second detector above the attraction electrode so as to detect the SEs therethrough, thereby obtaining a SEs image. The single-beam apparatus may further comprise a third detector above that being-inspected surface and on a reflection side of the PE beam so as to collect backscattered electrons generated by the PE beam and travelling towards the reflection side (called as Bright-field BSEs), thereby obtaining a Bright-field BSEs image.

The magnetic objective lens may have an upper pole-piece and a lower pole-piece both forming an axial magnetic-circuit gap. The first scanning deflector can be inside the axial magnetic-circuit gap so as to generate small deflection aberrations. The magnetic objective lens may comprise a permanent magnet and an excitation coil. The condenser lens may be a magnetic lens which has an inner pole-piece and an outer pole-piece both forming a radial magnetic-circuit gap. The single-beam apparatus may further comprise an acceleration tube to establish a high-energy region which is around the optical axis, starting from or below the gun aperture plate and stop above the first scanning deflector.

The first detector is preferred positively biased with respect to the sample so as to detect the Dark-field BSEs with high signal gain. The single-beam apparatus may further comprise a shielding box with a grid front plane to prevent an electric field generated by the first detector from influencing the PE beam, wherein the grid front plane directly faces the electron detection plane of the first detector so that the Dark-field BSEs can pass through and be detected.

The present invention therefore provides a multi-beam apparatus which comprises a sample stage for supporting a sample and making a being-inspected surface thereof upturned, and a plurality of single-beam units above that being-inspected surface. Each of said single-beam units comprises an electron source emitting primary electrons along an optical axis of the single-beam unit, a gun aperture plate below the electron source and having at least one first opening, a condenser lens below the gun aperture plate and aligned with the optical axis, a beam-limit aperture plate below the condenser lens and having at least one second opening, a magnetic objective lens below the beam-limit aperture plate and aligned with the optical axis, a first scanning deflector inside a bore of the magnetic objective lens, a first detector below the magnetic objective lens and having a through hole, and an attraction electrode beside the first detector and above that being-inspected surface. The primary electrons form a primary electron beam (PE beam). One of the first openings is aligned with the optical axis and limits a current of the PE beam to a first current value. One of the second openings is aligned with the optical axis and limits the current of the PE beam to a second current value. The magnetic objective lens comprises an excitation coil and a permanent magnet. The through hole of the first detector is on an electron detection plane of the first detector and aligned with the optical axis so that the PE can pass through. An illumination angle formed between the optical axis and a normal of that being-inspected surface is larger than 0°. The condenser lens and magnetic objective lens together focus the PE beam onto that being-inspected surface, thereby forming illumination thereon. The electron detection plane of the first detector faces aslant that being-inspected surface so as to collect backscattered electrons which are generated therefrom by the PE beam and travel towards an incidence side thereof (called as Dark-field BSEs). The attraction electrode attracts secondary electrons generated from that being-inspected surface by the PE beam (called as SEs) to prevent the SEs from hitting the first detector. The first scanning deflector deflects the PE beam so as to scan that being-inspected surface, thereby obtaining a Dark-field BSEs image by the first detector. Therefore each of the single-beam units inspects an area on that being-inspected surface, and consequently the plurality of single-beam units inspects a plurality of corresponding areas on that being-inspected surface simultaneously or on a schedule.

Each single-beam unit may further comprise a second scanning deflector above the first scanning deflector, wherein the first and second scanning deflectors together deflect the PE beam so as to scan that being-inspected surface with smaller deflection aberrations. The illumination angle of each single-beam unit is preferred equal to or larger than 45°.

The attraction electrode of each single-beam unit may have a grid structure so as to attract and make the SEs pass therethrough. Each single-beam unit may further comprise a second detector above the attraction electrode so as to detect said SEs therethrough, thereby obtaining an SEs image. Each single-beam unit can further comprises a third detector above that being-inspected surface and on a reflection side of the PE beam so as to collect backscattered electrons generated by the PE beam and traveling towards that reflection side (called as Bright-field BSEs), thereby obtaining a Bright-field BSEs image.

The magnetic objective lens of each single-beam unit may have an upper pole-piece and a lower pole-piece both forming an axial magnetic-circuit gap. The first scanning deflector of each single-beam unit can be inside the axial magnetic-circuit gap to generate small deflection aberrations.

The condenser lens of single-beam unit can be a magnetic lens with a permanent magnet and an excitation coil. Each single-beam unit may further comprise an acceleration tube to establish a high-energy region which is around the optical axis, staring from or below the gun aperture plate and stop above the first scanning deflector.

The first detector of each single-beam unit may be positively biased with respect to the sample so as to detect the Dark-field BSEs with high signal gain. Each single-beam unit may further comprise a shielding box with a grid front plane to prevent an electric field generated by the first detector from influencing the PE beam, wherein the grid front plane directly faces the electron detection plane of the first detector so that the Dark-field BSEs can pass through and be detected.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein the same or like reference numerals designate the same or like structural elements, and in which:

FIG. 3 is a schematic illustration of a configuration for inspecting particles on a sample surface in accordance with another embodiment of the present invention.

DETAILED DESCRIPTION OF EXAMPLE EMBODIMENTS

Figure 1A:
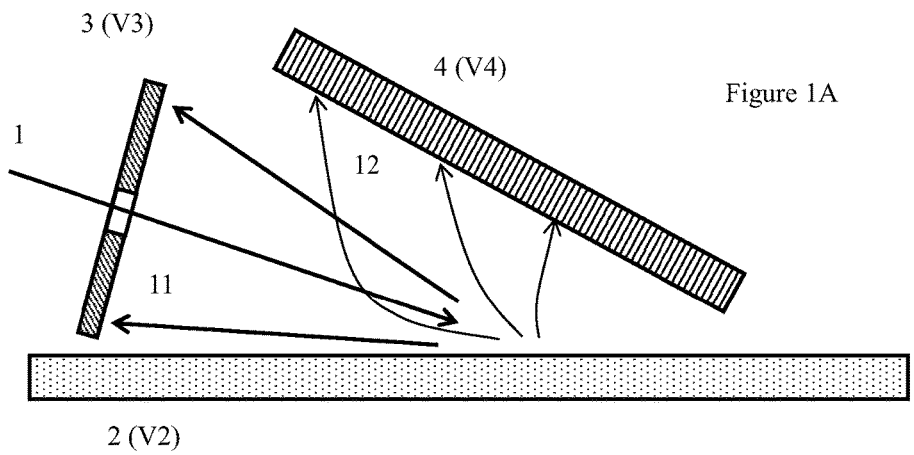
FIGS. 1A-1C are schematic illustrations of a fundamental configuration for particle inspection of a sample in accordance with one embodiment of the present invention.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, particle means any kind of uninvited protrusions.

In this invention, X, Y and Z axes form Cartesian coordinate, and a sample surface is on XOY plane.

In this invention, "axial" means "in the optical axis direction of an apparatus, column or a lens", while "radial" means "in a direction perpendicular to the optical axis".

As it is well known that when a PE beam impinges on a sample, secondary electrons (energy ≤50 eV) and backscattered electrons (50 eV<energy≤PE landing energy) will be generated and emitted from the sample surface. For Secondary electron (SE) emission, the angular distribution conforms Lambert's law (proportional to cos φ, where φ is emission angle relative to the surface normal) irrespective of energy and incidence angle α (relative to the surface normal) of PE beam and sample material. The SE yield δ increases with increasing incidence angle, and this characteristic provides possibility to image topography of the sample surface.

For Backscattered electron (BSE) emission, the backscattered coefficient η increase with increasing incidence angle α and atomic number, and this enable the imaging of both topography and material contrast of the sample surface. The angular distribution depends on energy and incidence angle α of PE beam and sample material, which generally consists of two parts, a diffusely scattered part with Lambert' distribution and a reflection-like part with emission maximum. In the range α=0°~60°, the diffusely scattered part remain approximately constant, which is an advantage for observation of material contrast. The reflection-like emission maximum is getting obvious with increasing incidence angle, i.e. in the case of oblique incidence ($\alpha \geq 45$).

If there is a particle on a sample surface, the values of incidence angle of a PE beam will be different when respectively hitting the sample surface and the particle due to the differences in normal direction. This difference provides possibilities for detecting the particle by material contrast and topography contrast. High contrast of a detection signal results in high detection sensitivity for the particle. To get high contrast, it is advantage to reduce the background component (due to the collection of the electrons emitted from the sample surface) and/or increase the feature component (due to the collection of the electrons emitted from the particle). In terms of the foregoing characteristics, this invention provides a method to detect particles on a sample surface by detecting Dark-field BSE image with high contrast, and one of its basic configurations is shown in FIGS. 1A, 1B, 3 4A, 4B and 4C.

In FIG. 1A, a PE beam 1 passes through a hole of a detector 3 and illuminates a surface of a sample 2 by oblique incidence. Consequently, BSEs 11 and SEs 12 are generated from the illuminated area of the sample surface. Most of BSEs 11 travel to the reflection side, and a very small part of BSEs 11 will travel to the incidence side and collected by the detector 3. Most of SEs 12 will travel upwards. In order to make the detector 3 not collecting SEs 12, an electrode 4 is placed above the illuminated area of the sample surface and slightly positively biased with respect to the sample 2 and the detector 3 to attract SEs 12 away from hitting the detector 3.

Figure 1B:
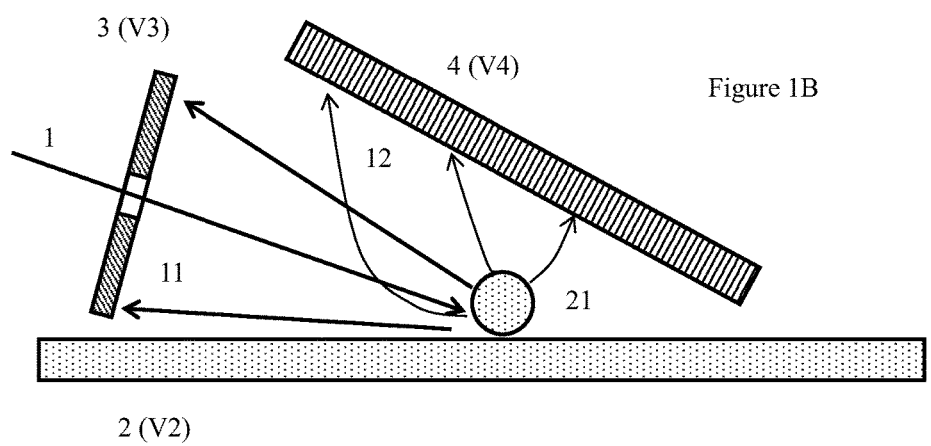

For the sample surface having particles thereon, the PE beam 1 may hit a particle as shown in FIG. 1B if the sample surface is scanned by some ways such as scanning the PE beam 1 and/or moving the sample in the directions parallel to the sample surface. In this case, most of BSEs 11 generated from the illuminated area of the particle travel to the incidence side of the PE beam 1 and consequently are collected by the detector 3, while SEs 12 will be attracted by the electrode 4 and consequently not hit the detector 3.

Figure 1C:
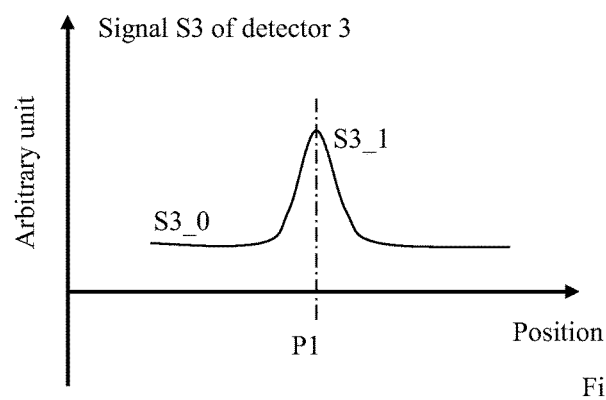

FIG. 1C shows the detection signal S3 of the detector 3 when the sample surface is scanned. The abscissa shows the geometric location on the sample surface and the ordinate shows the detection signal S3 of the detector 3 in arbitrary unit. As the PE beam 1 approaches the particle position P1, the detection signal S3 is getting strong from the lower value S3_0 to the higher value S3_1. Because the detector 3 only detects a small part of the diffusely scattered BSEs from the sample surface and a large part of both the diffusely scattered BSEs and the reflection-like scattered BSEs from the particle, the value S3_0 is very small with respect to the value S3_1. Therefore the particle will be shown in the scanning image with a dark background and a high contrast which is shown in the equation (1). Accordingly, the scanning image is a Dark-field BSE image.

$$\text{Contrast} = \frac{S3\_1 - S3\_0}{S3\_1 + S3\_0} \quad (1)$$

Figure 2A:
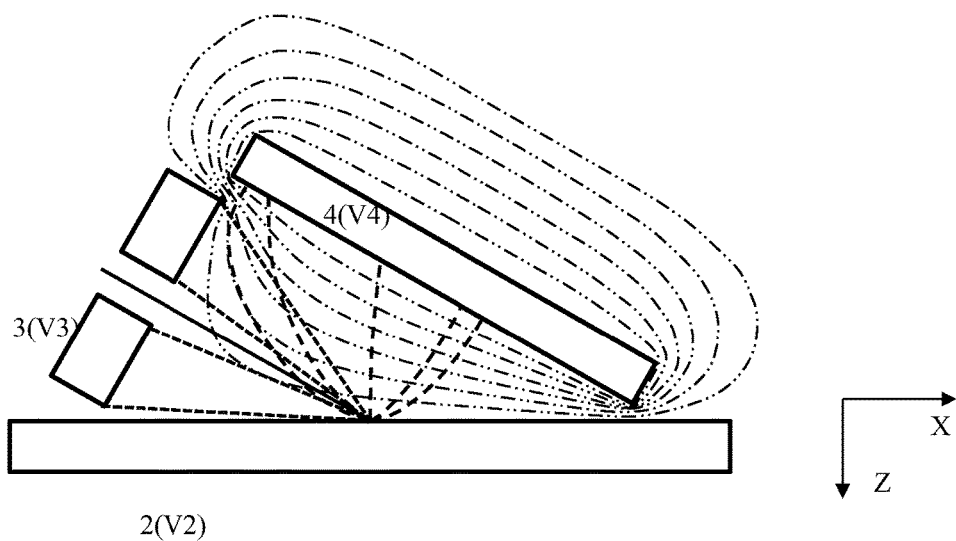
FIGS. 2A and 2B show a simulation result of an example of the configuration in accordance with the embodiment of the present invention shown in FIG. 1A.
Figure 2B:
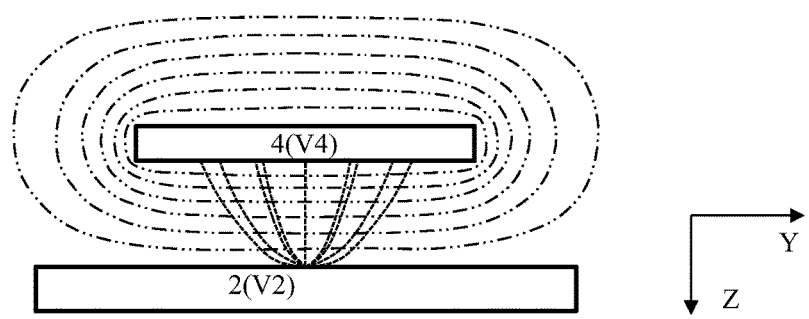

FIGS. 2A and 2B show the trajectories of PE, SE and BSE and the equipotential lines of an example of the forgoing configuration, respectively in the meridional plane XOZ and the sagittal plane YOZ. The incidence angle $\alpha$ of the PE beam 1, in this embodiment, is 60°, and the distance is 20 mm from the detector 3 to the sample surface along the incidence direction of the PE beam 1. When the potentials V2 and V3 of the sample 2 and the detector 3 are equal and the potential V4 of the electrode 4 is 40V higher than V2 and V3, more than 90% SEs are attracted to hit the electrode 4.

FIG. 3 shows another way to prevent SEs 12 from hitting the detector 3. A gird 5 is placed between the detector 3 and the sample and preferred to be close to the detector. The grid 5 is made of materials of electrical conductor and its potential V5 is slightly negatively biased with respect to the potential V2 of the sample 2. In this case, the potential V4 of the electrode 4 can be equal to slightly higher than V2.

Figure 4A:
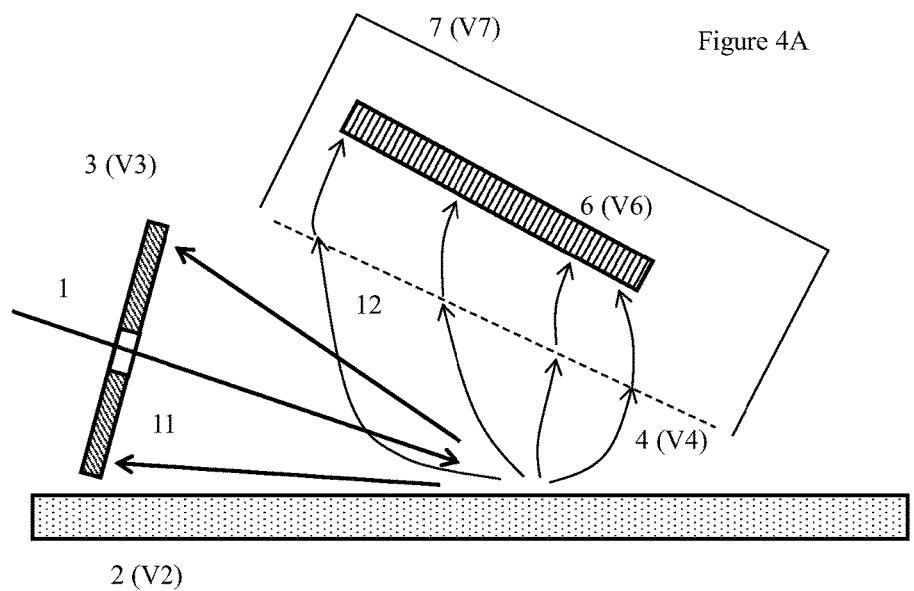
FIG. 4A is a schematic illustration of a configuration for multifunctional inspection of a sample in accordance another embodiment of the present invention.
Figure 4B:
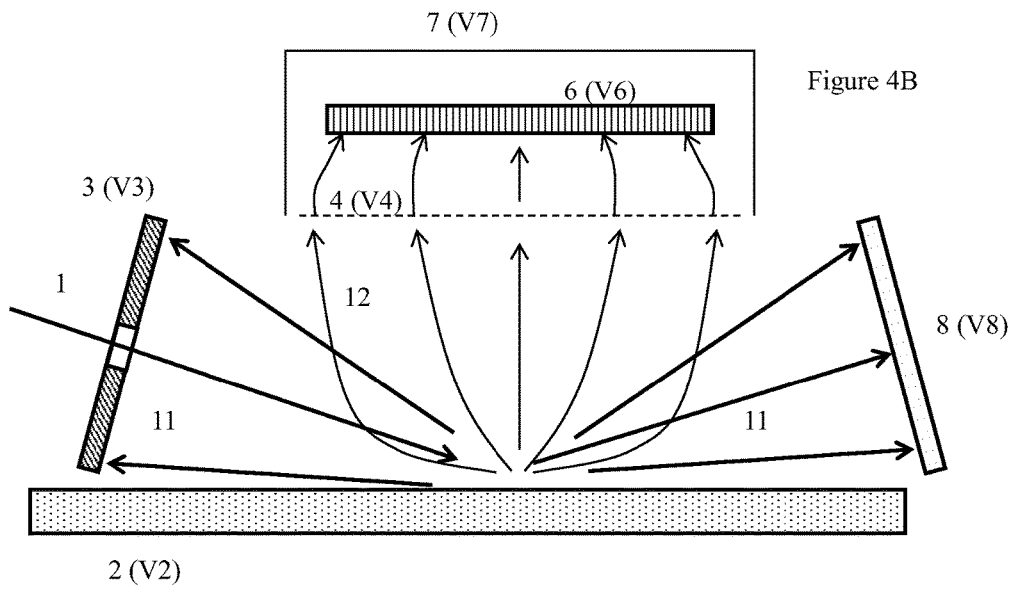
FIG. 4B is a schematic illustration of a configuration for multifunctional inspection of a sample in accordance another embodiment of the present invention.
Figure 4C:
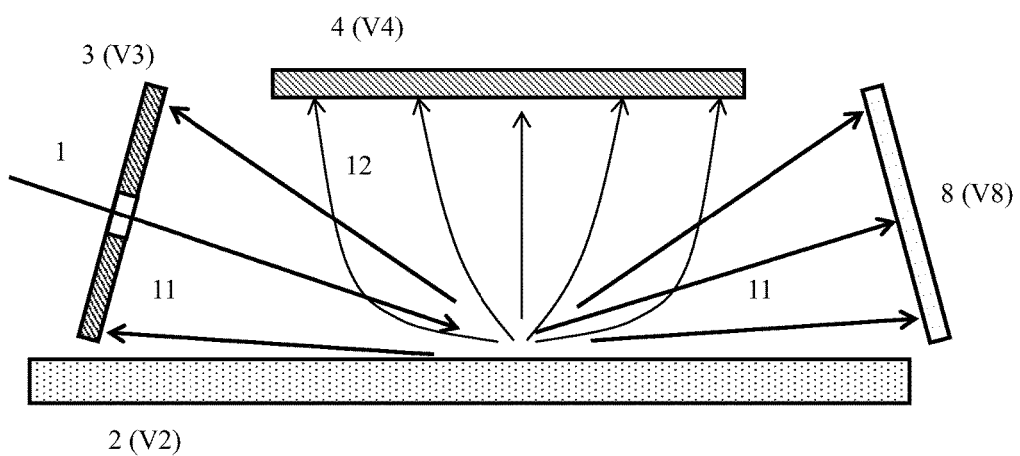
FIG. 4C is a schematic illustration of a configuration for multifunctional inspection of a sample in accordance another embodiment of the present invention.

In the foregoing basic configurations, the SEs 12 and BSEs 11 on the reflection side can also be detected to form SE image and Bright-field BSE image. Although these two images are not advantageous for particle inspection because the particle will be shown in a bright background and a lower contrast, the Bright-field BSE image can show the material contrast on the sample surface and the SE image can show the topography of the sample surface. Therefore, the separation of the Dark-field BSE image, the Bright-field BSE image and the SE image provides possibilities for multifunctional inspections as well as particle inspection. FIGS. 4A~4C show how to detect the SE image and the Bright-field image in the basic configuration shown in FIG. 1A.

In FIG. 4A, the electrode 4 has a grid structure, and a SE detector 6 is placed above the electrode 4. The potential V6 of the SE detector 6 is much higher than the potential V2 of the sample 2 to attract and accelerate the SEs passing through the grid 4 so as to obtain a high gain on the SE detection. The grid 4 and the electrically-shielding cover 7 enclose the SE detector 6 so as to avoid the electrical field thereof leaking out. The potential V7 of the electrically-shielding cover 7 can be equal to V4 or V2. The combination of the grid 4, the detector 6 and the cover 7 is called as SE detection unit. In FIG. 4B, a Bright-field BSE detector 8 is further added and placed on the reflection side so as to detect BSEs 11 on the reflection side. Compared with FIG. 1A, in FIG. 4C only a Bright-field BSE detector 8 is added and placed on the reflection side so as to detect BSEs 11 on the reflection side. As shown in FIG. 3, a grid can be placed between the Bright-field detector 8 and the sample 2 so as to prevent SEs 12 from hitting the detector 8 as well.

Figure 5A:
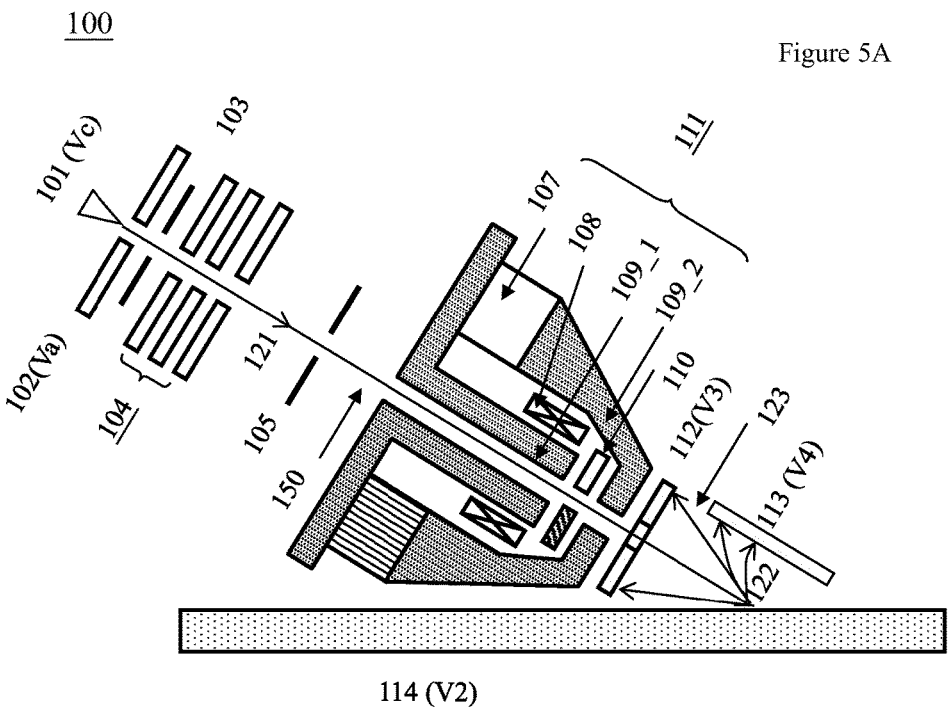
FIG. 5A is a schematic illustration of an apparatus for particle inspection of a sample in accordance with another embodiment of the present invention.
Figure 5B:
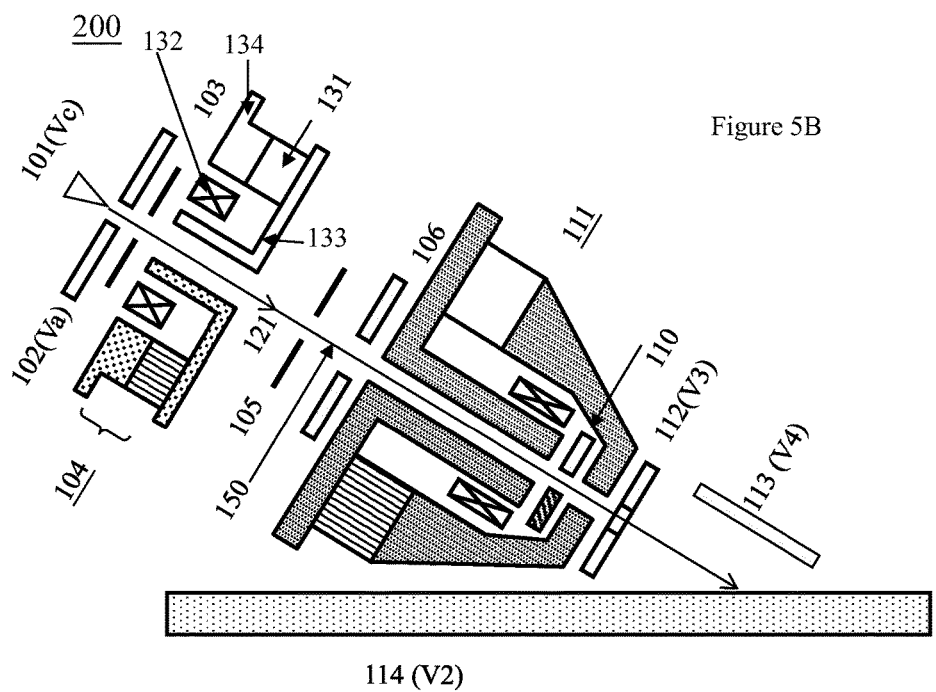
FIG. 5B is a schematic illustration of an apparatus for particle inspection of a sample in accordance with another embodiment of the present invention.
Figure 5C:
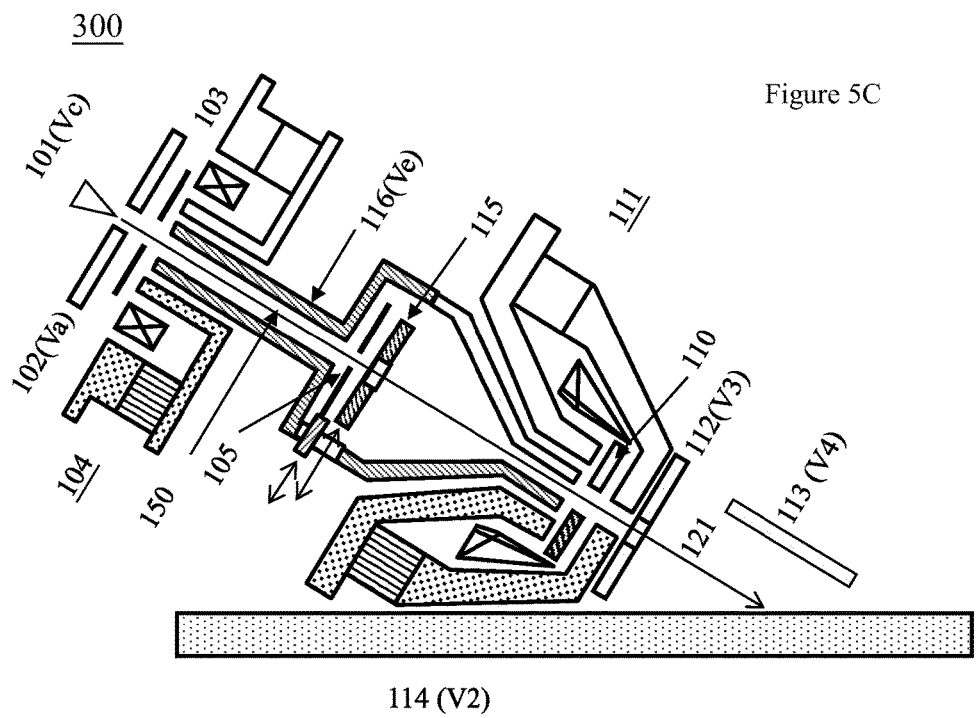
FIG. 5C is a schematic illustration of an apparatus for particle inspection of a sample in accordance with another embodiment of the present invention.

Besides the collection efficiency and purity of the signal electrons, the size, current and landing energy of the probe spot of the PE beam 1 on the sample surface are the other factors significantly determining the contrast of each image mentioned above. A larger probe current within a smaller spot size will be advantageous for obtaining a higher contrast. The backscattered coefficient $\eta$ is approximately independent of the landing energy in the range 5~100 keV. Below 5 keV, $\eta$ decreases for heavy elements and increases for light elements with decrease in the landing energy. Because most of materials used in semiconductor manufacturing are light elements, it is preferred to use $\leq 5$ keV landing energy, i.e. in LVSEM mode. For the applications which need the SE image while inspecting particles, a lower landing energy such as <3 keV will be better to get a high SE yield $\delta$. This invention provides three embodiments of LVSEM in terms of the foregoing considerations, as shown in FIGS. 5A~5C. FIGS. 5A~5C only show the basic detection for particle inspection. They can further comprise the SE detection unit and/or the Brightfield BSE detector if necessary.

FIG. 5A shows an elementary embodiment which comprises the column 100, the dark-field BSE detector 112 and the SE-attraction electrode 113. The PE beam 121 is emitted from an electron source 101 and travel downward along the optical axis 150 of the column 100. To realize an oblique incidence of the PE beam 121 on the surface of the sample 114, the optical axis 150 is set to form an angle 60° with respect to the surface normal of the sample. The electron source 101 is set at a negative potential Vc with respect to the ground potential, while the anode 102 and the gun aperture 103 are at a potential Va higher than Vc and the ground potential respectively. Therefore the PE beam 121 is accelerated to a kinetic energy e·(Vc−Va) after passing through the gun aperture 103. Then the PE beam 121 is slightly focused by the condenser lens 104 and partially limited by the beam-limit aperture 105 to get a desired probe current on the sample 114. The condenser lens 104 can be a magnetic lens although it is shown as an electrostatic lens here. Next the PE beam 121 passes through the objective lens 111 and a scanning deflector 110 and finally impinges on the surface of the sample 114. The objective lens 111 finely focuses the PE beam 121 to form a small probe spot, while the deflector 110 deflects the PE beam 121 to scan the sample surface with the finely focused probe spot, thereby obtaining a field of view (FOV). The SE-attraction electrode 113 attracts SEs 122 so as to make the detector 112 only detect the dark-field BSEs 123.

Figure 6:
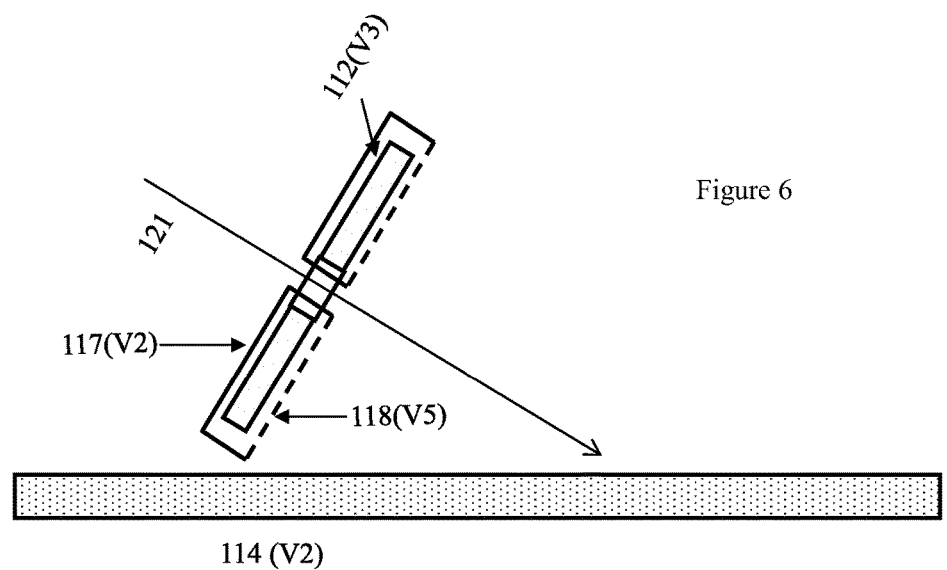
FIG. 6 is a schematic illustration of a configuration of a detector for particle inspection of a sample in accordance with another embodiment of the present invention.

Except the electron source 101, the anode 102 and the electrode 113, all the other parts of the column 100 are set at the ground potential for the sake of convenience in column manufacturing. In this case the landing energy of the PE beam 121 is equal to e·Vc. If the detector 112 needs to be set at a potential much higher than the ground potential for obtaining a higher signal gain, it can be covered by a shielding box as shown in FIG. 6. In FIG. 6, the shielding box 117 is set at the ground potential and has a front grid 118 for the BSEs passing through. The potential V5 of the grid 118 can be equal to the ground potential or a light lower than the ground potential for repelling SE from hitting the detector 112. Either or both of the gun aperture 103 and beam-limit aperture 105 can be a plate with one opening or a movable plate with several different-size openings for obtaining various desired values of the probe current and corresponding small spot sizes.

The objective lens 111 can be either an electrostatic lens or a magnetic lens. However, a magnetic objective lens is preferred due to its small aberrations. For a magnetic objective lens, its aberrations decreases with decrease in its working distance (WD, the axial distance between the lower surface of the objective lens and the sample surface). Because of the oblique incidence, a short WD requires the objective lens 111 has a small volume and a conical front end. Accordingly, the objective lens 111 is proposed to have a permanent magnet 107 as well as an excitation coil 108. The strong permanent magnet 107 provides a fixed magnetic excitation which takes the fixed and large part for the required magnetic excitation range, and the coil 108 provides an adjustable magnetic excitation to cover the rest small part. Because the coil 108 only takes space much less than a conventional magnetic lens without permanent magnet, the objective lens 111 can be constructed small in volume. The upper pole-piece 109_1 and the lower pole-piece 109_2 sandwiches the permanent magnet 107 and forms an axial magnetic-circuit gap close to the optical axis 150. The magnetic field leaked out through this magnetic-circuit gap focuses the PE beam 121 onto the sample surface. The scanning deflector 110 can be either electrostatic or magnetic. However, an electrostatic one is preferred due to its ability to deflect the PE beam 121 with high speed. The scanning deflector 110 is placed inside the magnetic-circuit gap between the upper and lower pole-pieces so as to reduce the aberrations generated by the deflection.

During scanning, defocus of the PE beam 121 on the sample surface will appear because the sample surface is not perpendicular to the optical axis 150 in oblique incidence. The defocus can be dynamically compensated by adjusting the excitation current of the coil 108. Besides, the scanning deflector 110 can be a multiple lens which can generate a dipole field for deflection scanning and a round lens field for the compensation of the defocus. In addition, the SE-attraction electrode 113 will slightly divert the PE beam 121 as well as attracting SEs 122. The deviation will incur a position shift of the PE beam 121 on the sample surface. The shift can also be compensated by the scanning deflector 110.

FIG. 5B shows an advanced embodiment which can provide a larger probe current within a smaller spot size and over a larger FOV, in comparison with the foregoing elementary embodiment. For the sake of the clarity, the column is denoted as 200. In the column 200, at first, the magnetic condenser lens 104 is designed to have a radial magnetic-circuit gap so that the electron source 101 can be deeply immersed in the magnetic field of the magnetic condenser lens 104. The deep immersion greatly reduces the aberrations of the condenser lens 104, especially when the condenser lens 104 works with a strong focus power to make a large PE current passing through the beam-limit aperture 105. In addition, similar to the objective lens 111, the condenser lens 104 can have a permanent magnet 131 as well as an excitation coil 132. The strong permanent magnet 131 provides a fixed magnetic excitation which takes the fixed and large part for the required magnetic excitation range, and the excitation coil 132 provides an adjustable magnetic excitation to cover the rest small part. Because the excitation coil 132 only takes space much less than a conventional magnetic lens without permanent magnet, the condenser lens 104 can be constructed small in volume. The inner pole-piece 133 and the outer pole-piece 134 sandwiches the permanent magnet 131 and forms the radial magnetic-circuit gap facing the electron source 101. Secondly, one more scanning deflector 106 is added and placed above the scanning deflector 110. These two scanning deflectors together realize swing deflection (proposed in U.S. Pat. No. 6,392,231) to further reduce off-axis aberrations due to the deflection scanning. The effect can greatly increase the effective FOV.

FIG. 5C shows a more advanced embodiment which can provide a larger probe current within a smaller spot size, in comparison with the foregoing embodiments. For the sake of the clarity, the column is denoted as 300. In FIGS. 5A and 5B, from the gun aperture 103 to the sample 114, the PE beam 121 travels with the energy same as the landing energy which is equal to e·Vc and ≤5 keV. If the PE beam 121 has a large current, the Coulomb effect occurring on the way will obviously increase the final spot size of the PE beam 121. In the column 300, to reduce the Coulomb effect, a high-energy region is established around the optical axis 150 and between the gun aperture and the scanning deflector 110 by placing an acceleration tube 116 over there. The acceleration tube 116 is set at a potential Ve much higher than the sample potential V2 which is equal to the ground potential. Consequently, the PE beam 121 passes through the high-energy region with energy e·(Vc−Ve) much higher than the landing energy e·Vc. The higher the energy of the electron beam is, the weaker the Coulomb effect is. Although the upper end of the acceleration tube 116 is shown close to the gun aperture here, it can be connected with the gun aperture, and thereby extending the high-energy region upwards to the gun aperture.

In FIG. 5C, one more detector 115 is placed below the beam-limit aperture 105 to detect the BSEs passing through the hole of the Dark-field BSEs detector 112 so as to increase the collection efficiency of the signal electrons. The detector 115 has a hole for the PE beam 121 passing through. The acceleration tube 116 has one or more side openings designed for installing and replacing the beam limit aperture 105 and the detector 115 when operating routine maintenance.

Figure 7A:
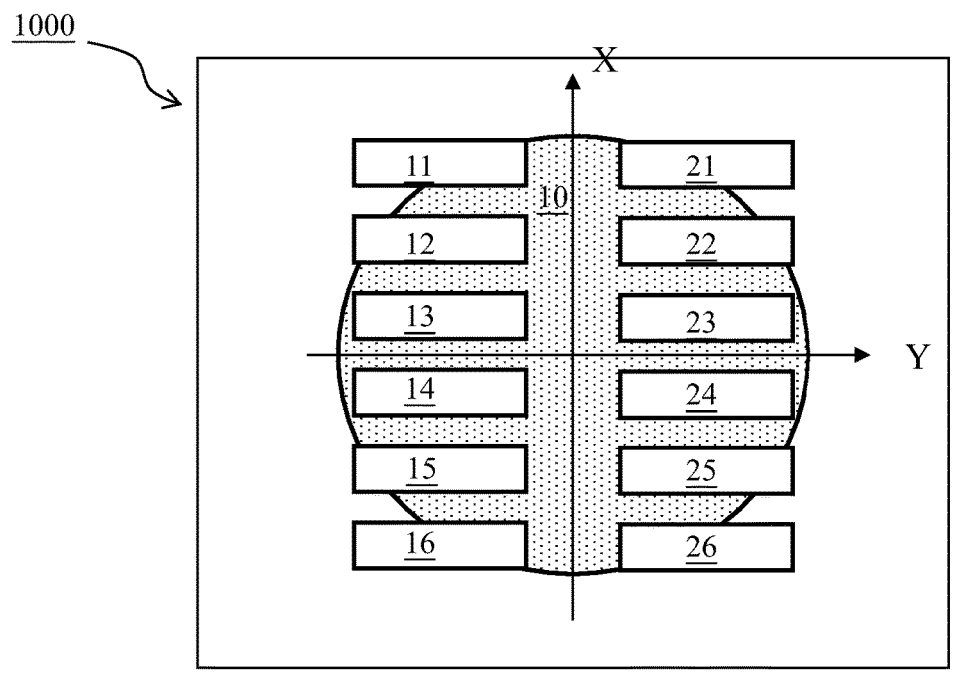
FIGS. 7A and 7B are schematic illustrations of a multi-column apparatus for particle or multifunctional inspection of a sample in accordance with another embodiment of the present invention.
Figure 7B:
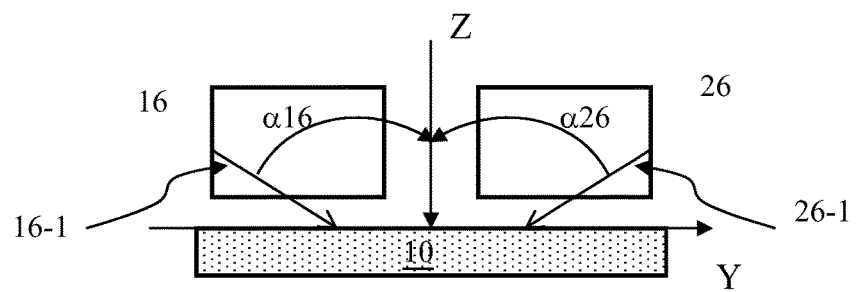

Although the methods used in FIGS. 5B and 5C enable the columns to generate a smaller spot size with a large probe current, the inspection throughput by a single beam may be not sufficient for some applications in mass production. In those cases, using multiple beams to do inspection is a powerful solution. For structuring a multi-beam apparatus with multiple single-beam columns, the number of electron beams available for a wafer or a mask is limited by the spatial interval required to physically accommodate two adjacent single-beam columns in parallel. The column embodiments shown in FIGS. 5A~5C are small in volume due to the employment of permanent magnet in the magnetic objective lens. This advantage can greatly reduce the spatial interval, thereby increasing the number of electron beams available for a wafer or a mask. FIG. 7A and FIG. 7B are respectively top and side views of a multi-beam apparatus 1000 with twelve units 11~16 and 21~26 for inspecting particles on a wafer/mask respectively and simultaneously. Each of the twelve units comprises a column as shown in FIGS. 5A~5C and a detection configuration as shown in FIGS. 1A, 1B, 3 4A, 4B and 4C. The units 11~16 are placed on the left side and form a left-side group, while the units 21~26 are placed on the right side and form a right-side group. Each unit of the left-side group illuminates the surface of the sample 10 in oblique incidence from the left side, such as the PE beam 16-1 of the unit 16 shown in FIG. 7B. Accordingly, each unit of the right-side group illuminates the surface of the sample 10 in oblique incidence from the right side, such as the PE beam 26-1 of the unit 26 shown in FIG. 7B.

In summary this invention provides methods to construct e-beam apparatuses for inspecting small particles on the surface of a sample such as wafer and mask. The apparatuses fundamentally provide both high detection efficiency and high throughput by forming Dark-field BSE image. Besides, they are able to form SE image and Bright-field BSE image simultaneously to realize additional inspection functions such as inspecting physical and electrical defects on the sample surface as well. The e-beam apparatus can comprise only one single-beam unit to do single-beam inspection or multiple single-beam units to form multi-beam inspection for achieving high throughput. In the column of a single-beam unit, the objective lens or both of the objective lens and the condenser lens is/are compacted by using permanent magnet inside. The compact structure not only enables the favorable oblique incidence of the PE beam, but also increases the number of single-beams available for a wafer or a mask. This invention will especially benefit the particle inspection in semiconductor yield management.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the invention as limited only by the appended claims.

What is claimed is:

1. A device of detecting electrons generated from a surface of a sample on a sample stage, comprising:
   a first detector having a through hole and inclined towards said sample stage;
   a primary electron beam source, generating a primary electron beam passing through said through hole, and illuminating said surface of said sample by oblique incidence, wherein said surface generates backscattered electrons (BSEs) and secondary electrons when illuminated, and said first detector collects BSEs traveling towards said first detector to generate a Dark-field BSE image; and
   a first electrode adjacent to a path of said primary electron beam, wherein said first electrode attracts and prevents secondary electrons generated from said surface of said sample from hitting said first detector;
   wherein, said first detector is on a first plane at a first angle relative to said sample stage, said first electrode is on a second plane at a second angle relative to said sample stage, and said first plane and said second plane are intersecting;
   wherein, a first virtual axis, perpendicular to said sample stage and intersecting said sample, intersects said first electrode, and said first detector is adjacent to said first virtual axis; and
   wherein the sample stage has a first voltage potential and the first detector has a second voltage potential, wherein said first voltage potential and said second voltage potential are equal.

2. The device according to claim 1, wherein said first electrode has a grid structure so as to attract and make said secondary electrons pass through.

3. The device according to claim 2, further comprising a second detector behind said first electrode so as to detect said secondary electrons therethrough.

4. The device according to claim 3, further comprising a third detector on a reflection side of said primary electron beam, wherein said third detector is inclined towards said sample stage so as to collect BSEs generated from said surface of said sample by said primary electron beam and traveling towards said reflection side.

5. The device according to claim 1, further comprising a third detector on a reflection side of said primary electron beam, wherein said third detector is inclined towards said sample stage so as to collect BSEs generated from said surface of said sample by said primary electron beam and traveling towards said reflection side.

6. The device according to claim 1, further comprising a second electrode in front of said first detector, wherein said second electrode has a grid structure so as to repel and prevent said secondary electrons from passing through and make the Dark-field BSEs pass through.

7. The device according to claim 1, wherein the first electrode has a third voltage potential, wherein said third voltage potential is greater than said first voltage potential.

* * * * *